(12) United States Patent
Yamada (10) Patent No.: US 6,902,445 B2
(45) Date of Patent: Jun. 7, 2005

(54) SOCKET FOR ELECTRICAL PARTS (75) Inventor: Takayuki Yamada, Saitama (JP)

(73) Assignee: Enplas Corporation, Saitama (JP)

( * ) Notice: Subject to any disclaimer, the term of this patent is extended or adjusted under 35 U.S.C. 154(b) by 0 days.

(21) Appl. No.: 10/821,877

(22) Filed: Apr. 12, 2004

(65) Prior Publication Data

US 2004/0214455 A1 Oct. 28, 2004

(30) Foreign Application Priority Data

Apr. 22, 2003 (JP) ........................................ 2003-116589

(51) Int. Cl.$^7$ ............................................... H01R 4/48
(52) U.S. Cl. ..................................................... 439/862
(58) Field of Search ............................ 439/70, 71, 525, 439/862

(56) References Cited

U.S. PATENT DOCUMENTS

| 4,585,291 | A | * | 4/1986 | Noschese ...................... 439/70 |
| 5,249,971 | A | * | 10/1993 | Lai et al. ...................... 439/70 |
| 6,302,727 | B1 | * | 10/2001 | Fedorjaka ..................... 439/500 |
| 6,663,444 | B2 | * | 12/2003 | Yeh .............................. 439/862 |
| 2003/0104731 | A1 | * | 6/2003 | Chang .......................... 439/862 |

FOREIGN PATENT DOCUMENTS

JP          2000-82554        3/2000

* cited by examiner

Primary Examiner—Tho D. Ta
(74) Attorney, Agent, or Firm—Staas & Halsey LLP (57) ABSTRACT A socket for an electrical part includes a socket body having one surface to which an electrical part is to be mounted and another surface to which a printed circuit board is to be mounted, and a contact pin provided for the socket body for achieving electrical connection between the electrical part and the printed circuit board. The contact pin is provided with a springy portion formed with a plurality of curved portions, an electrical part side contact portion formed to a front end side of the springy portion so as to be contacted to a terminal of the electrical part to be thereby electrically connected thereto, a printed circuit board side contact portion formed to one of the curved portions of the springy portion so as to be contacted to the printed circuit board to be thereby electrically connected thereto, and an electric path formed between these contact portions.

15 Claims, 9 Drawing Sheets

PRIOR ART

SOCKET FOR ELECTRICAL PARTS

BACKGROUND OF THE INVENTION

1. Field of the Invention

The present invention relates to a socket for an electrical part, such as semiconductor device (called "IC package" hereinlater), disposed between the electrical part and a printed circuit board so as to establish an electrical connection therebetween.

2. Related Art

Figure 13:
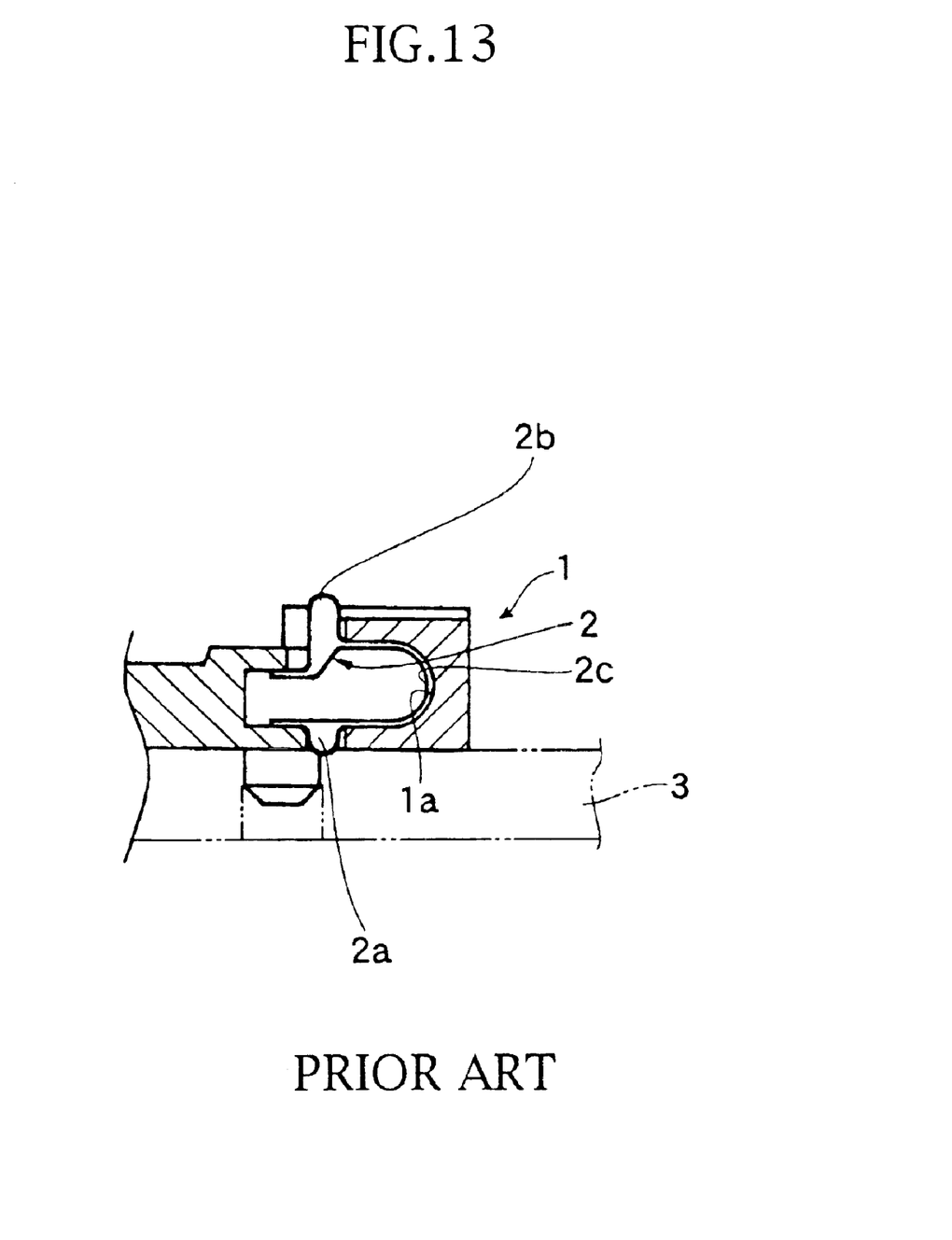
FIG. 13 is a sectional view of arrangement of a contact pin according to a conventional structure.

One example of a known socket of this type is shown in FIG. 13, which is for example, disclosed in the Japanese Laid-open Patent Publication No. 2000-82554.

Referring to FIG. 13, a socket has a socket body 1 formed with a recessed portion 1a into which a contact pin 2 is accommodated. A printed circuit board 3 is disposed below the socket body 1 so as to arrange an IC package as electrical part, not shown in FIG. 13, on the upper side of the socket body 1.

The contact pin 2 is provided with a first contact portion 2a as a lower portion in the illustration, a second contact portion 2b as an upper portion in the illustration and an approximately U-shaped intermediate portion 2c having elastic or springy property. This U-shaped intermediate portion 2c is positioned between the first and second contact portions 2a and 2b so as to connect these portions 2a, 2b, 2c.

The first contact portion 2a contacts the printed circuit board 3 and the second contact portion 2b, on the other hand, contacts a terminal of the IC package to thereby establish an electrical connection between the printed circuit board 3 and the IC package terminal through the contact pin 2.

According to such electrical connection, a performance test of the IC package is carried out by using an IC package test machine, and in accordance with this test result, it is discriminated whether the IC package is defective or not as a product.

In the known structure mentioned above, however, the U-shaped elastic portion 2c of the contact pin 2 urges both the contact portions 2a and 2b to ensure the contacting pressure between the printed circuit board 3 and the IC package terminal. Accordingly, in order to ensure displacement of both the contact portions 2a and 2b, it is obliged for the U-shaped portion to have a relatively long length, as an electric path, which may results in an adverse result of a high frequency IC package performance test.

SUMMARY OF THE INVENTION

An object of the present invention is therefore to substantially eliminate defects or drawbacks encountered in the prior art mentioned above and to provide a socket for electrical parts capable of reducing or making short an electric path between an electrical part and a printed circuit board while well keeping a contacting pressure to both the electrical part and the printed circuit board.

This and other objects can be achieved according to the present invention by providing, in one aspect, a socket for an electrical part comprising:

a socket body having one surface to which an electrical part is to be mounted and another surface, opposing to the one surface, to which a printed circuit board is to be mounted; and a contact pin provided for the socket body for achieving electrical connection between the electrical part and the printed circuit board, the contact pin comprising:

a springy portion formed with a plurality of curved portions;

an electrical part side contact portion formed to a front end side of the springy portion so as to be contacted to a terminal of the electrical part to be thereby electrically connected thereto;

a printed circuit board side contact portion formed to one of the curved portions of the springy portion so as to be contacted and electrically connected to the printed circuit board; and an electric path formed between the electrical part side contact portion and the printed circuit board side contact portion of the springy portion.

In a preferred embodiment, the printed circuit board side contact portion may be formed to one curved portion nearest to the front end.

The springy portion may be formed with first curved portion positioned nearest to the front end thereof and a second curved portion apart therefrom, the second curved portion having a radius of curvature smaller than that of the first curved portion. Further, in a modification, the second curved portion may have a radius of curvature larger than that of the first curved portion.

It may be preferred that the electric path of the springy portion formed between the printed circuit board side contact portion and the electrical part side contact portion has substantially a linear structure.

Furthermore, an intervening member may be disposed between the printed circuit board side contact portion of the contact pin and the printed circuit board so as to electrically connect the printed circuit board side contact portion of the contact pin and the printed circuit board. The contact pin may be provided with a base portion which is mounted to the socket body, from which the springy portion extends, and the intervening member extends from the base portion. The intervening member may be directly provided to the socket body so as to extend between the circuit board side contact portion and the printed circuit board.

In another aspect, there may be provided a contact pin, which is provided for a socket body of a socket for an electrical part, comprising:

a base portion mounted to the socket body; and a springy portion extending from the base portion, the springy portion including a plurality of curved portions including a curved portion formed to a front end portion of the springy portion as an electrical part side contact portion and another curved portion formed on the side of the base portion as a printed circuit board side contact portion.

According to the present invention of the structures and characters mentioned above, the contact pin is formed with a plurality of curved portions to thereby ensure a springy elasticity and, hence, ensure a suitable contacting pressure. In the present invention, since one of the curved portions forming a part of the springy portion is formed as the circuit board side contact portion, the electric path between the terminal of the electrical part and the printed circuit board can be made short.

According to the preferred embodiment in which two curved portions are formed to the contact pin and the one curved portion nearest to the front end of the springy portion is formed to have a radius of curvature larger than that of another curved portion apart from the above one curved portion (base portion side of the springy portion), the another curved portion is hardly deformed as compared with the first mentioned one, so that the first mentioned one is hardly displaced in the contact pin extension direction (lateral or horizontal direction). Accordingly, the first mentioned curved portion formed as the circuit board side contact portion does not slide on the electrode portion of the printed circuit board, thus obviating the damage of the electrode portion.

Furthermore, the location of the intervening portion between the circuit board side contact portion and the printed circuit board prevents the circuit board side contact portion from directly sliding on the printed circuit board, thus obviating the damage of the electrode portion of the printed circuit board.

Moreover, since the intervening portion is extended from the base portion of the contact pin, this intervening portion is formed so as to be integrated with the contact pin thereby obviating the increase in the number of parts to be produced.

The nature and further characteristic features of the present invention may be made further clear from the following descriptions made with reference to the accompanying drawings.

BRIEF DESCRIPTION OF THE DRAWINGS

In the accompanying drawings:

FIG. 7 illustrates an IC package according to the first embodiment, in which

DESCRIPTION OF THE PREFERRED EMBODIMENTS

Preferred embodiments of the present invention will be described hereunder respectively with reference to the accompanying drawings.

[First Embodiment]

A first embodiment of the present invention is now described with reference to FIGS. 1 to 8.

Figure 3:
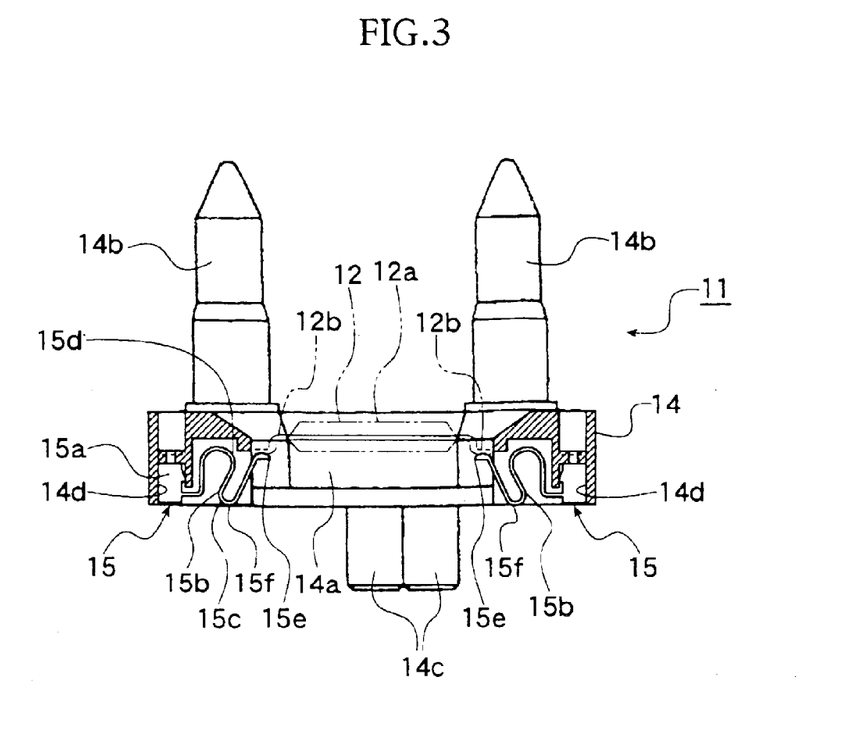
FIG. 3 is a sectional view taken along the line III—III in FIG. 1.
Figure 4:
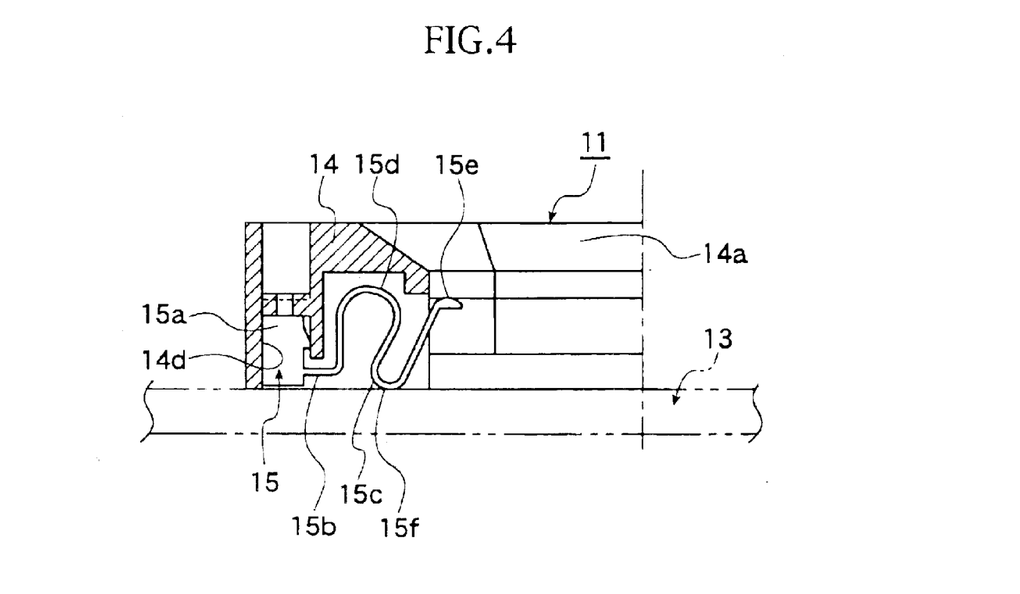
FIG. 4 is a sectional view of the IC socket of FIG. 1 showing an arrangement of a contact pin thereof according to the first embodiment.
Figure 5:
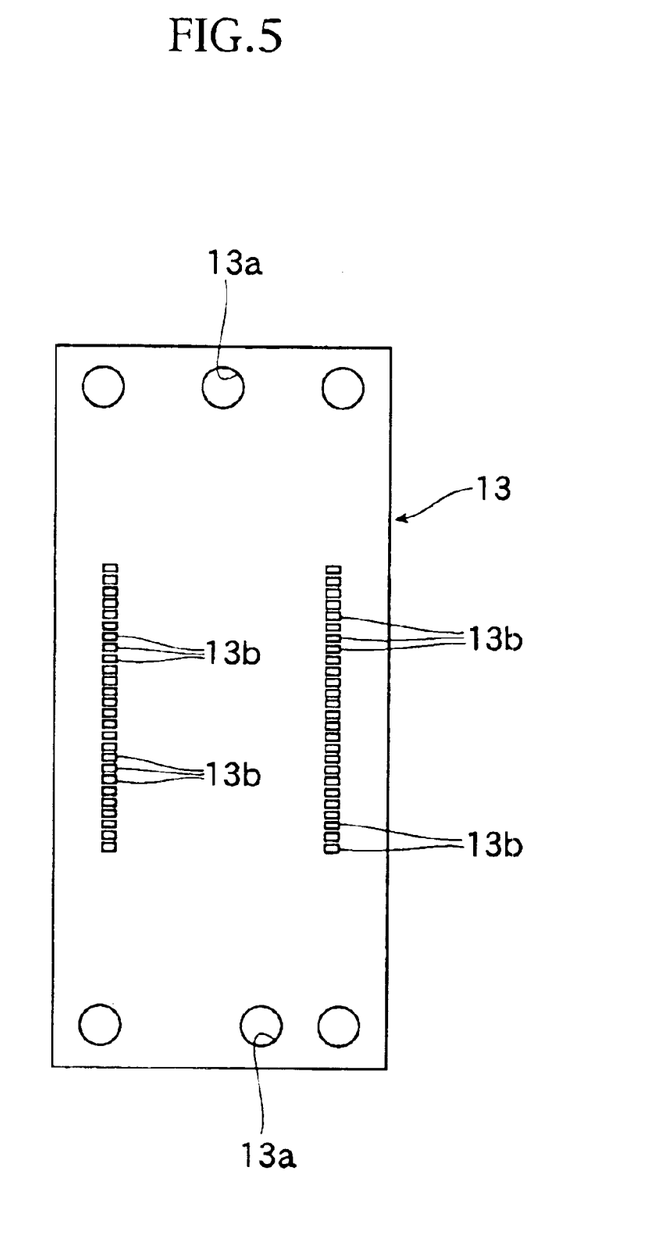
FIG. 5 is an illustrated plan view of a printed circuit board according to this embodiment.
Figure 6:
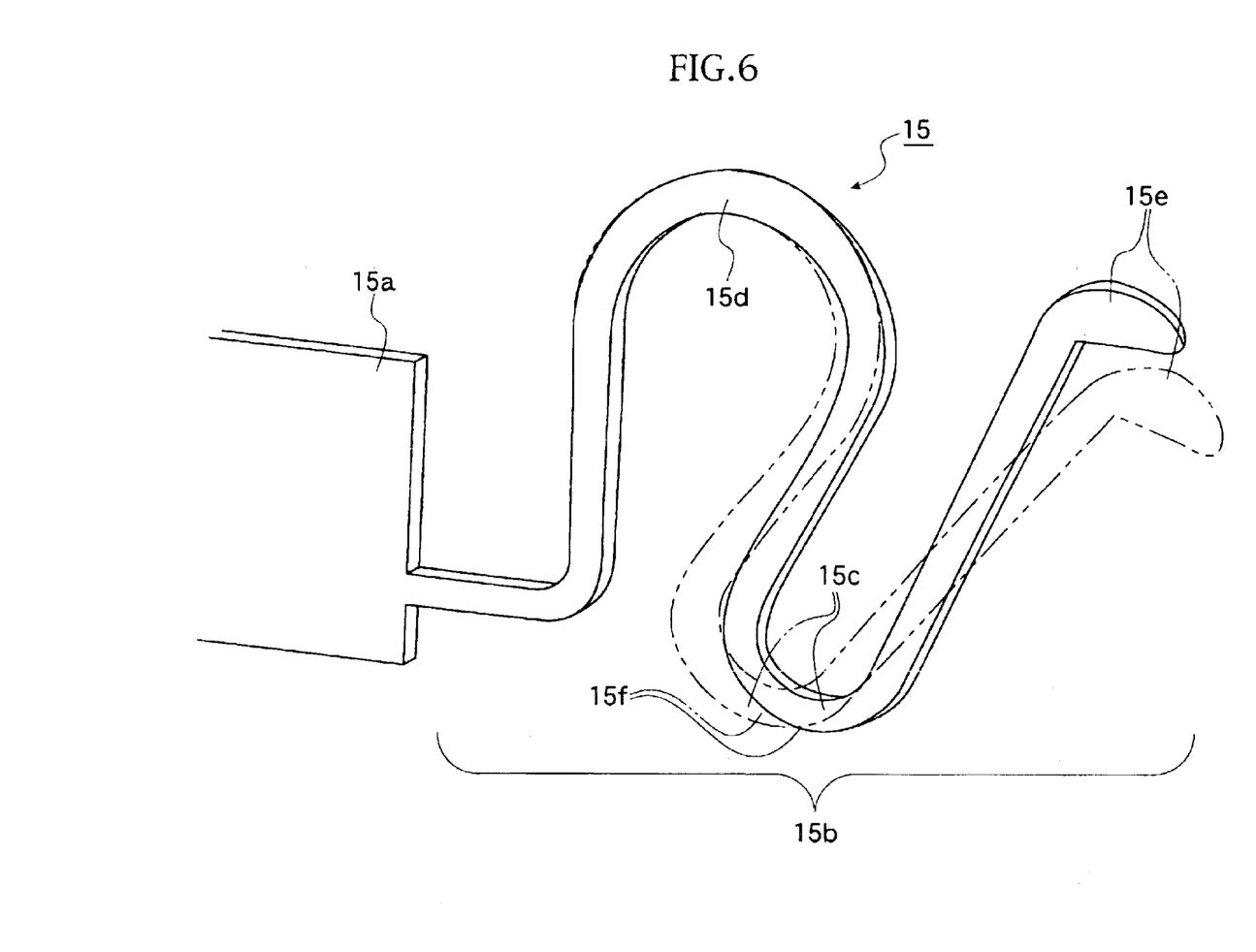
FIG. 6 is a perspective view, in an enlarged scale, showing a motion of the contact pin.
Figure 7A:
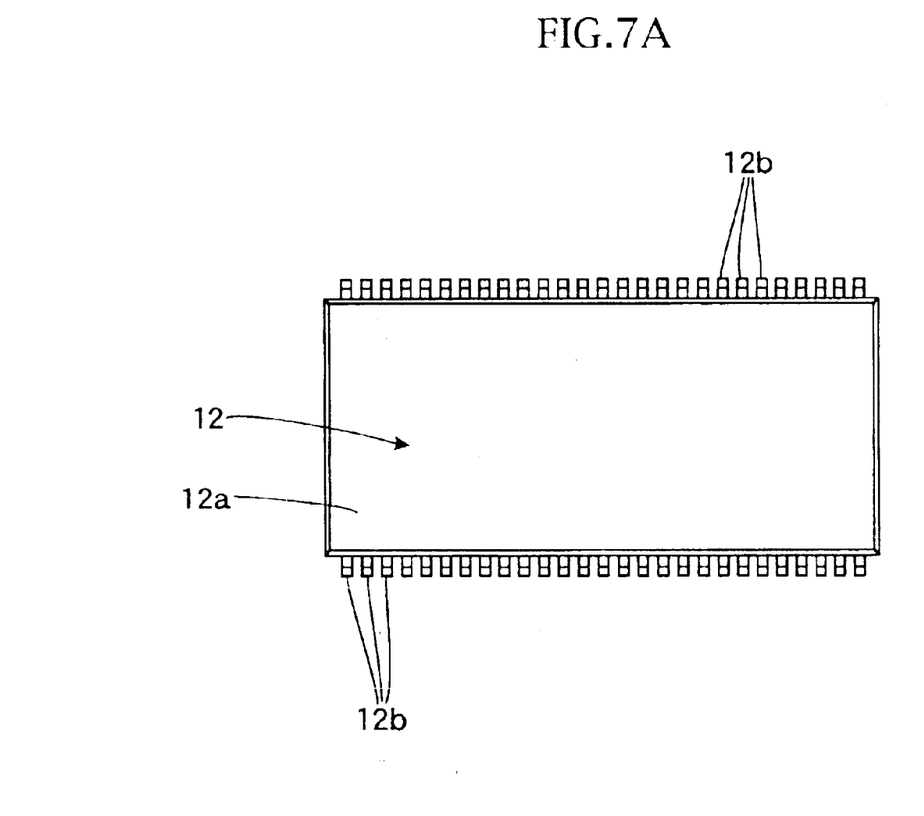
FIG. 7A is a plan view of the IC package and FIG. 7B is a right side view of FIG. 7A.
Figure 7B:
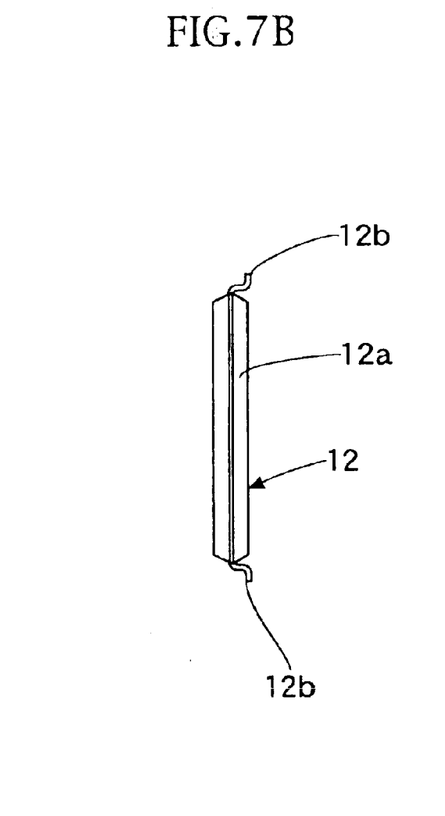

Referring to FIGS. 1 to 8, reference numeral 11 denotes an IC socket as "socket for electrical parts", which is utilized for making electrical connection between a terminal 12b of an IC package 12 as "an electrical part" such as shown in FIG. 7 and a printed circuit board 13 on the IC test device side as shown in FIG. 5 for the purpose of carrying out a performance test of the IC package 12.

As shown in FIGS. 7A and 7B, the IC package 12 is provided with a number of terminals 12b projecting, in crank shape, sideways from a side surface of a package body 12a, having a rectangular structure in the plan view, at a predetermined pitch.

Figure 1:
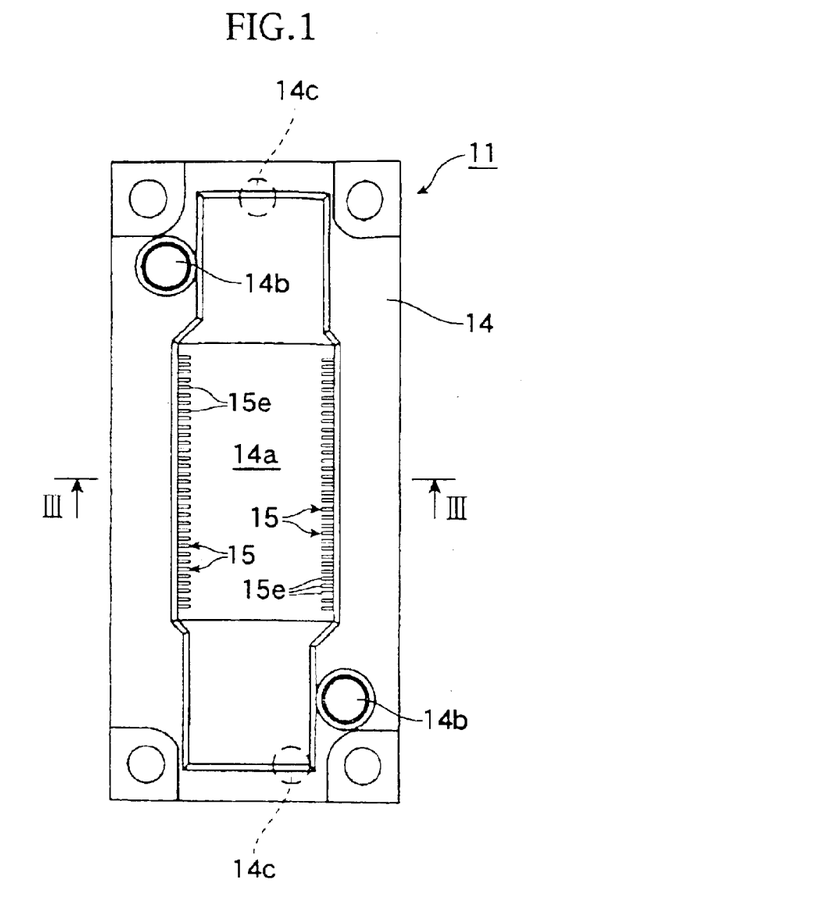
FIG. 1 is an illustrated plan view of an IC socket according to a first embodiment of the present invention.
Figure 2:
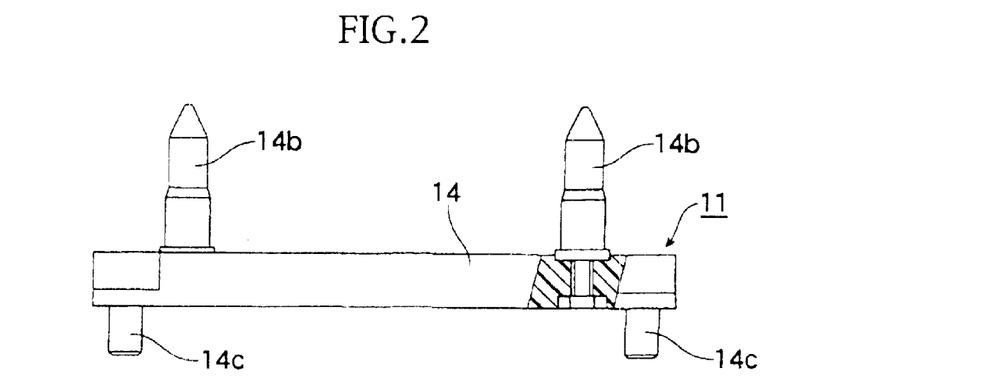
FIG. 2 is a right side view, partially in section, of the IC socket of FIG. 1.

On the other hand, as shown in FIGS. 1 and 3, the IC socket 11 has a socket body 14 made of a material having an insulating property such as synthetic resin, to which a number of contact pins 15 are arranged so as to establish an electrical connection between the IC package 12 and the printed circuit board 13 through the contact pins 15.

The socket body 14 has a rectangular shape in the plan view and formed, at its central portion, with an opening 14b. The socket body 14 is further provided with a pair of positioning pins 14b at an upper surface portion thereof so as to project upward and a pair of fitting pins 14c at a lower surface portion thereof so as to project downward.

Figure 8:
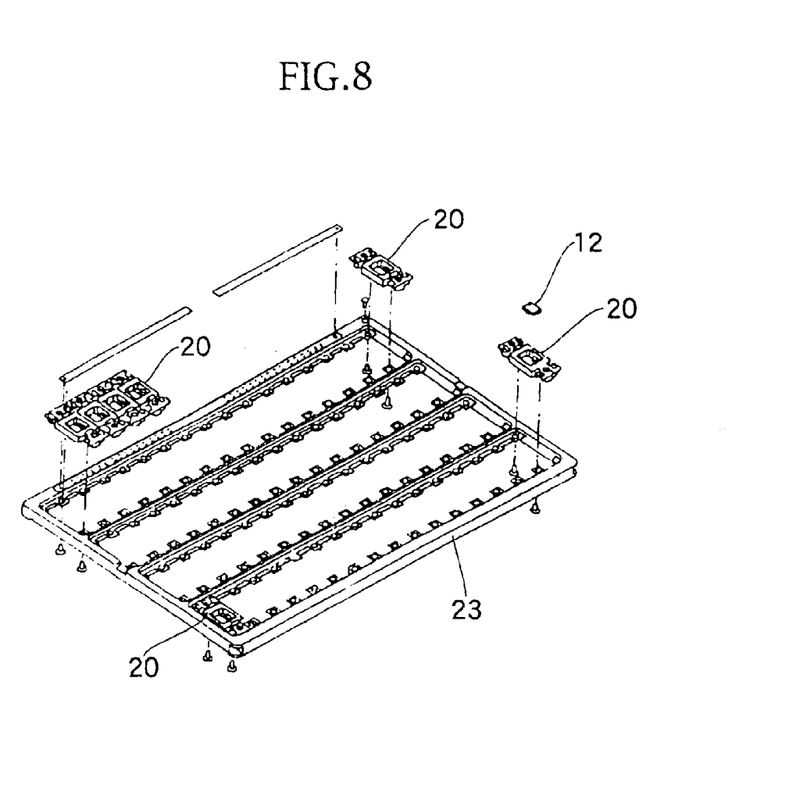
FIG. 8 is a perspective view showing a test tray, an IC carrier and the like in connection with the embodiment of the present invention.

These positioning pins 14b are fitted to an IC carrier 20 holding the IC package 12 as shown in FIG. 8 to thereby achieve the positioning between the IC socket 11 and the IC carrier 20, which is conveyed by an automatic machine, for example. The fitting pins 14c are, on the other hand, fitted to fitting holes 13a, shown in FIG. 5, formed to the printed circuit board 13 to thereby achieve the positioning between the IC socket 11 and the printed circuit board 13.

The contact pin 15 according to this first embodiment is formed, through a punching process, from a thin plate member having conductive and springy (elastic) properties. A number of these contact pins 15 are arranged in proportion to the number of the terminals 12b of the IC package 12 and the interval between the terminals, and as shown in FIGS. 3, 4 and 6, each of the contact pins 15 has a base portion 15a to be mounted to the socket body 14 and a springy portion or elastic portion 15b extending from the base portion 15a.

The springy portion 15b has two curved portions 15c and 15d so as to provide a S-shape in the entire form thereof and an electrical part side contact portion 15e, electrically contacting the terminal 12b of the IC package 12 formed at the front end (free end) side of the springy portion 15b.

Further, one of the curved portions 15c disposed near the front contact portion 15e is formed as a (printed) circuit board side contact portion 15f which is contacted to the printed circuit board 13 to establish the electrical connection therebetween. This circuit board side contact portion 15f has the same sectional shape as that of the other springy portion of the contact pin 15.

The contact pin 15 also has an intermediate portion between the circuit board side contact portion 15f and the electrical part side contact portion 15e, and this intermediate portion is formed substantially linearly as an electric path between the IC package terminal 12b and the printed circuit board 13.

Further, the curved portion 15d far apart from the front end portion of the springy portion 15b in comparison with the other curved portion 15c has a radius of curvature larger than that of the curved portion 15c.

The base portion 15a of the contact pin 15 is fitted and then fixed to the fitting hole 14d formed to the socket body 14 so that the circuit board side contact portion 15f contacts the electrode portion 13b of the printed circuit board 13 to thereby establish an electrical connection therebetween.

On the other hand, the electrical part side contact portion 15e has a protruded shape projecting upward, as viewed, so as to contact the terminal 12b of the IC package 12 to be urged on the side of the terminal 12b by the springy portion 15b. The electrical part side contact portion 15e projects into the opening 14a formed to the socket body 14 as shown in FIG. 1 or 4.

The IC socket 11 of the structure mentioned above will be used and operated in the following manner.

The fitting pins 14c of the IC socket 11 are preliminarily fitted to the fitting holes 13a of the printed circuit board 13 so as to mount the IC socket 11 to the predetermined position of the printed circuit board 13.

On the other hand, as shown in FIG. 8, a plurality of IC carriers 20 are mounted to the test tray 23 of a handler, and the IC package 12 is positioned and accommodated to these IC carriers 20. Under the state, the test tray 23 is conveyed by a device, not shown, and the IC carriers 20 are positioned on a plurality of IC sockets 11 arranged to the predetermined positions of the printed circuit board 13 on the side of the IC test device.

Thereafter, the test tray 23 is lowered so as to position and fit the positioning pins 14b of the IC sockets 11 to the positioning holes formed to the IC carriers 20.

In this state, the IC carriers 20, i.e., IC package 12, the IC socket 11 and the printed circuit board 13 are assembled together in the predetermined positional relationship.

The IC package 12 is pressed down from the upper side thereof by means of pressure contact piece, not shown, on the side of the handler, the terminal 12b of the IC package 12 is forcibly contacted to the electrical part side contact portion 15e of the contact pin 15, and then, the circuit board side contact portion 15f is forcibly contacted to the electrode portion 13b of the printed circuit board 13.

In this operation, the springy portion 15b of the contact pin 15 is elastically deformed from the state shown with the solid line in FIG. 6 to the state shown with the two-dot-chain line therein. In this moment, the terminal 12b of the IC package 12 abuts against the electrical part side contact portion 15e of the contact pin 15 with a predetermined contacting pressure, and then, the circuit board side contact portion 15f of the contact pin 15 abuts against the electrode portion 13b of the printed circuit board 13 with a predetermined contacting pressure.

Thus, the IC package 12 is electrically connected to the printed circuit board 13 through the IC socket 11, and it becomes possible to carry out the performance test of the IC package 12 by using an IC testing device. According to the result of this test, it is discriminated whether the IC package 12 is defective or not as product.

The elastic property of the springy portion 15b of the contact pin 15 could be ensured by forming a plurality of curved portions 15c and 15d, and moreover, the contacting pressure of the terminal 12b of the IC package 12 against the electrical part side contact portion 15e of the contact pin 15 and the contacting pressure of the circuit board side contact portion 15f of the contact pin 15 against the electrode portion 13b of the printed circuit board 13 can be also ensured.

Furthermore, since the curved portion 15c positioned nearest to the front end portion of the springy portion 15b is formed as the circuit board side contact portion 15f, the electric path from the electrical part side contact portion 15e to the circuit board side contact portion 15f can be made short and the performance test of the IC package 12 of high frequency can be done effectively.

Moreover, the portion between the electrical part side contact portion 15e and the circuit board side contact portion 15f, forming the electric path, provides approximately a straight structure, so that this electric path can be made short.

Further, in the described structure, the circuit board side contact portion 15f does not vary in its sectional shape and is formed as a part of the springy portion 15b, having substantially the same sectional shape as the other portions of the springy portion 15b, so that the springy portion 15b including the curved portions 15c and 15d can be entirely elastically deformed, thus ensuring the elastic force. On the other hand, incidentally, if the sectional shape or area of the circuit board side contact portion 15f varies, elastic deformations at portions between which this contact portion 15f is positioned will be caused in modes different from each other. As a result, it is difficult to form the springy portion in which the elastic deformation is continuously varying at the springy portion 15b including both the curved portions 15c and 15d.

[Second Embodiment]

Figure 9:
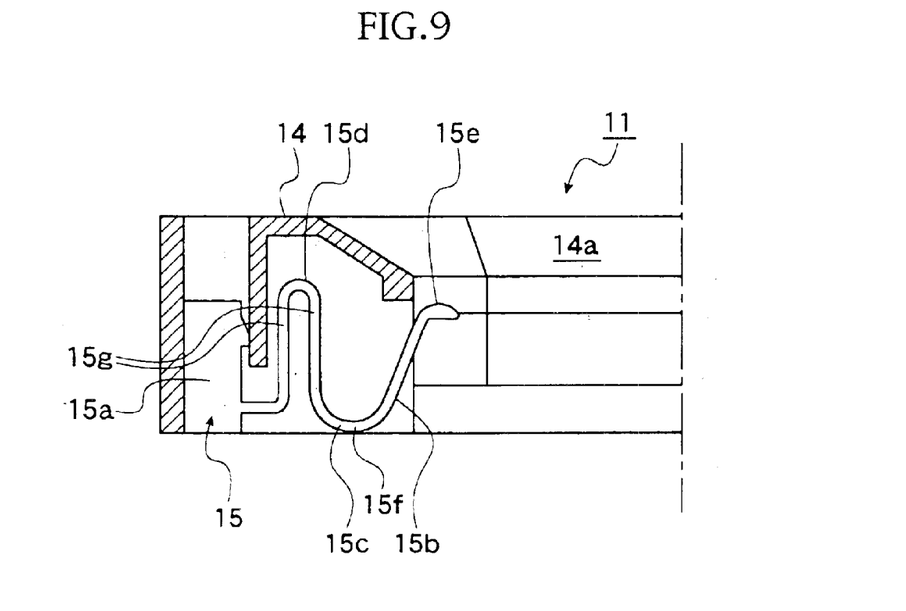
FIG. 9 is a sectional view, corresponding to FIG. 4, showing arrangement of the contact pin according to a second embodiment of the present invention.
Figure 10:
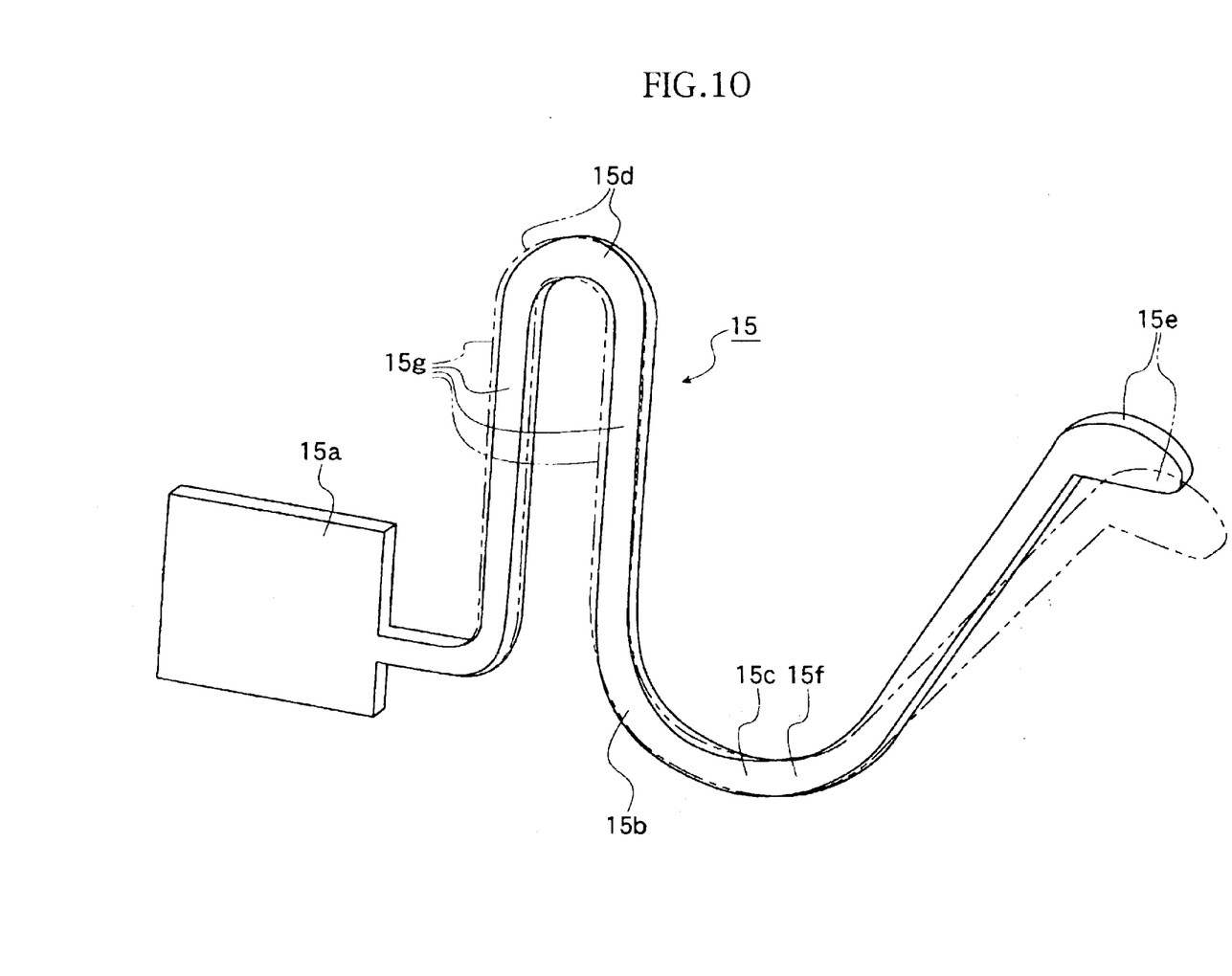
FIG. 10 is a perspective view, in an enlarged scale, showing a motion of the contact pin according to this second embodiment.

FIGS. 9 and 10 represent the second embodiment of the present invention.

In this second embodiment, further, the curved portion 15d far apart from the front end portion of the springy portion 15b in comparison with the other curved portion 15c has a radius of curvature smaller than that of the curved portion 15c, and approximately linear portions 15g of this springy portion 15b, between which the curved portion 15 is positioned, are formed to be substantially parallel to each other.

According to this structure of the springy portion 15b of the contact pin 15, when the springy portion 15b is elastically deformed from the position shown with the solid line in FIG. 10 to the position shown with the two-dot-chain line, the deformed amount (amount to be deformed) of the curved portion 15d having the smaller radius of curvature can be made smaller. Accordingly, in view of a matter that the curved portion 15c (i.e., the circuit board side contact portion 15f) positioned nearest to the front end of the springy portion 15b hardly deforms in an extending direction of the contact pin 15, the circuit board side contact pin 15f does not slide on the electrode portion 13b of the printed circuit board 13, thus effectively preventing the electrode portion 13b from being damaged.

Structures other than the above are substantially the same as those of the first embodiment mentioned hereinbefore, so that the details thereof are omitted herein.

[Third Embodiment]

Figure 11:
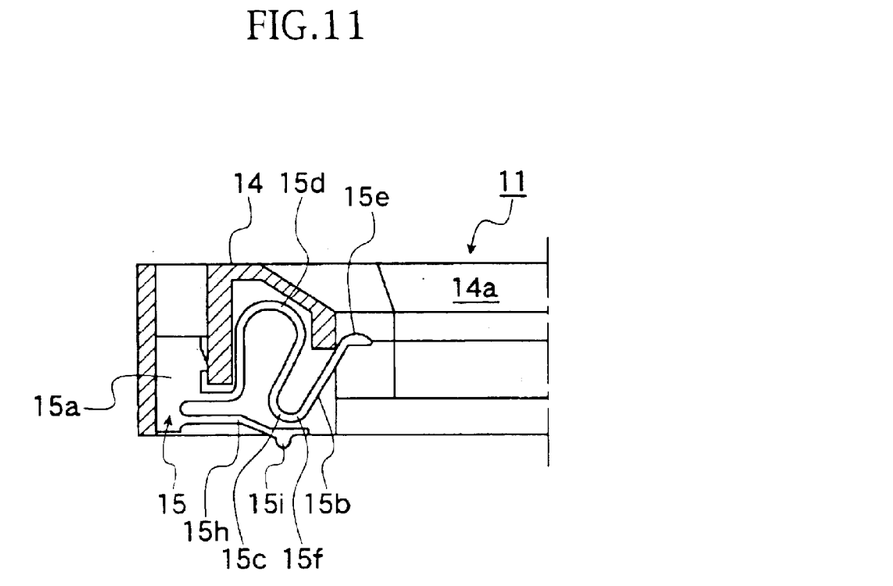
FIG. 11 is a sectional view, corresponding to FIG. 9, showing arrangement of the contact pin according to a third embodiment of the present invention.

FIG. 11 represents the third embodiment of the present invention, in which an intervening member or piece 15h is formed, as an extending piece 15h, to the base portion 15a of the contact pin 15 so as to extend in the same direction as the extension of the springy portion 15b, this extending piece 15h being positioned between the circuit board side contact portion 15f and the printed circuit board 13 so as to electrically connect them, and in this meaning, this member 15h may be intervening piece or extending piece.

The extending piece 15h has an end projection 15i projecting downward from the front end side thereof (i.e., lower side of the circuit board side contact portion 15f) so that this end projection 15i contacts the electrode portion 13b of the printed circuit board 13.

According to the structure of this third embodiment, the terminal 12b of the IC package 12 abuts against the electrical part side contact portion 15e of the contact pin 15 so as to be pressed thereby. Thus, the springy portion 15b is elastically deformed and, hence, the circuit board side contact portion 15f of the contact pin 15 abuts against the extending piece 15h, through which the electrical contacting and connection between the circuit board side contact portion 15f and the electrode portion 13b of the printed circuit board 13 can be established.

Further, in this structure, although the circuit board side contact portion 15f slightly slides with respect to the extending piece 15h, this extending piece 15h always contacts the electrode portion 13b of the printed circuit board 13 in an immovable manner. Thereby, the electrode portion 13b is never rubbed, and the electrode portion 13b can be hence prevented from being damaged.

Structures and functions of this third embodiment other than those mentioned above are substantially the same as those of the first embodiment, so that the details thereof are omitted herein.

[Fourth Embodiment]

Figure 12:
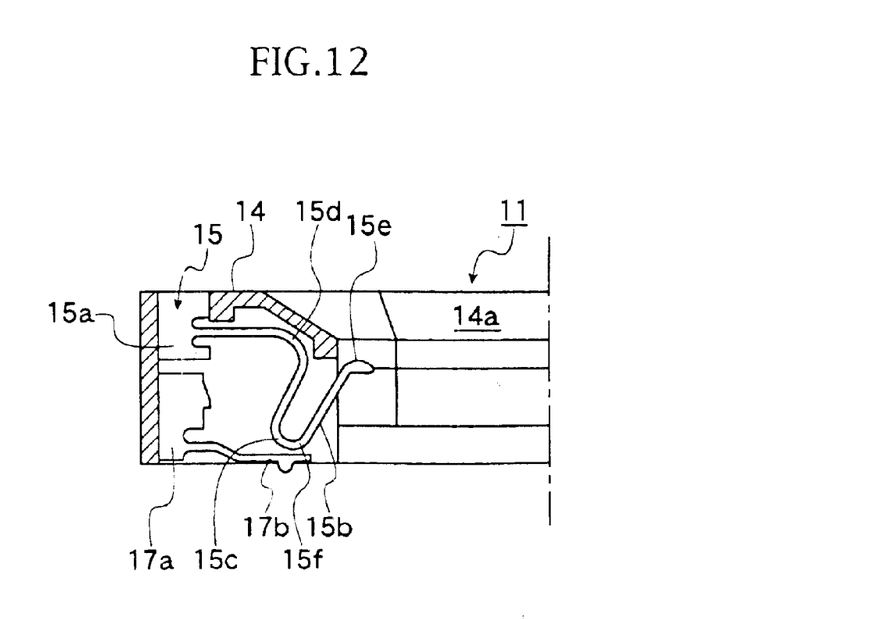
FIG. 12 is a sectional view, corresponding to FIG. 9, showing arrangement of the contact pin according to a fourth embodiment of the present invention.

FIG. 12 represents the fourth embodiment of the present invention.

In this fourth embodiment, a base member 17a is additionally provided, other than the base portion 15a of the contact pin 15, to the lower portion of the contact pin 15, and an extending piece 17b is formed, as an intervening member or piece, so as to extend outward from this base member 17a. In this arrangement, the base portion 15a of the contact pin 15 is positioned above and apart from this base member 17a.

According to this separate location of the contact pin 15 and the extending piece 17b of the base member 17a, it is possible to easily exchange only either one of the contact pin 15 or the base member 17a having the extending piece 17b.

Structures and functions of this third embodiment other than those mentioned above are substantially the same as those of the first embodiment, so that the details thereof are omitted herein.

It is to be noted that the present invention is not limited to the described embodiments and many other changes and modifications may be made without departing from the scopes of the appended claims.

For example, the types or kinds of the IC packages as electrical parts are not limited to that shown in FIGS. 7A and 7B and other types may be adopted, or electrical parts other than the IC package 12 mentioned above may be also applicable.

Furthermore, in the described embodiments, although the contact pins 15 each provided with two curved portions 15c and 15d are described, a contact pin provided with three or more curved portions may be usable.

What is claimed is:

1. A socket for an electrical part comprising:
   a socket body having one surface to which an electrical part is to be mounted and another surface, opposing to the one surface, to which a printed circuit board is to be mounted; and
   a contact pin provided for the socket body for achieving electrical connection between the electrical part and the printed circuit board, said contact pin comprising
      a springy portion formed with a plurality of curved portions,
      an electrical part side contact portion formed to a front end side of the springy portion so as to be contacted to a terminal of the electrical part so as to establish an electrical connection therebetween,
      a printed circuit board side contact portion formed to one of the curved portions of the springy portion so as to be contacted to the printed circuit board so as to establish an electrical connection therebetween, and
      an electric path formed between the electrical part side contact portion and the printed circuit board side contact portion,
   wherein said electric path of the springy portion formed between the printed circuit board side contact portion and the electrical part side contact portion has substantially a linear structure.

2. The socket for an electrical part according to claim 1, wherein said printed circuit board side contact portion is formed to one curved portion nearest to the front end of the springy portion.

3. The socket for an electrical part according to claim 1, wherein said springy portion is formed with first curved portion positioned nearest to the front end thereof and a second curved portion apart therefrom, said second curved portion having a radius of curvature smaller than that of the first curved portion.

4. The socket for an electrical part according to claim 1, wherein said springy portion is formed with a first curved portion positioned nearest to the front end thereof and a second curved portion apart therefrom, said second curved portion having a radius of curvature larger than that of the first curved portion.

5. The socket for an electrical part according to claim 4, wherein portions of the springy portion between which the second curved portion is formed are formed to be parallel to each other.

6. A socket for an electrical part comprising:
   a socket body having one surface to which an electrical part is to be mounted and another surface, opposing to the one surface, to which a printed circuit board is to be mounted; and
   a contact pin provided for the socket body for achieving electrical connection between the electrical part and the printed circuit board, said contact pin comprising
      a springy portion formed with a plurality of curved portions,
      an electrical part side contact portion formed to a front end side of the springy portion so as to be contacted to a terminal of the electrical part so as to establish an electrical connection therebetween,
      a printed circuit board side contact portion formed to one of the curved portions of the springy portion so as to be contacted to the printed circuit board so as to establish an electrical connection therebetween, and
      an electric path formed between the electrical part side contact portion and the printed circuit board side contact portion,
   wherein an intervening portion is disposed between the printed circuit board side contact portion of the contact pin and the printed circuit board so as to electrically connect the printed circuit board side contact portion of the contact pin and the printed circuit board.

7. The socket for an electrical part according to claim 6, wherein said contact pin is provided with a base portion which is mounted to the socket body from which said springy portion extends, and said intervening portion extends from the base portion.

8. The socket for an electrical part according to claim 6, wherein said intervening portion is mounted to the socket body so as to extend therefrom between the printed circuit board side contact portion and the printed circuit board.

9. The socket for an electrical part according to claim 6, wherein said printed circuit board side contact portion is formed to one curved portion nearest to the front end of the springy portion.

10. The socket for an electrical part according to claim 6, wherein said springy portion is formed with first curved portion positioned nearest to the front end thereof and a second curved portion apart therefrom, said second curved portion having a radius of curvature smaller than that of the first curved portion.

11. The socket for an electrical part according to claim 6, wherein said springy portion is formed with a first curved portion positioned nearest to the front end thereof and a second curved portion apart therefrom, said second curved portion having a radius of curvature larger than that of the first curved portion.

12. The socket for an electrical part according to claim 11, wherein portions of the springy portion between which the second curved portion is formed are formed to be parallel to each other.

13. A socket for an electrical part comprising:
a socket body having one surface to which an electrical part is to be mounted and another surface, opposing to the one surface, to which a printed circuit board is to be mounted; and
a contact pin provided for the socket body for achieving electrical connection between the electrical part and the printed circuit board, said contact pin comprising:
a base portion mounted to the socket body,
a springy portion extending from the base portion and being formed with a plurality of curved portions,
an electrical part side contact portion formed to a front end side of the springy portion so as to be contacted to a terminal of the electrical part so as to establish an electrical connection therebetween,
a printed circuit board side contact portion formed to one of the curved portions of the springy portion so as to be contacted to the printed circuit board so as to establish an electrical connection therebetween, and
an electric path formed between the electrical part side contact portion and the printed circuit board side contact portion, wherein
at least another one of the curved portions is disposed between the base portion and the printed circuit board side contact portion, and
when the electrical part is accommodated onto the socket and pressed down, the another one of the curved portions is elastically deformed and then the printed circuit board side contact portion is abutted on the printed circuit board.

14. A contact pin for a socket for an electrical part to be mounted to a socket body of the socket, the contact pin being designed to achieve electrical connection between the electrical part and a printed circuit board, comprising:
a base portion mounted to the socket body; and
a springy portion extending from the base portion, said springy portion including a plurality of curved portions;
an electrical part side contact portion formed to a front end side of the springy portion so as to contacted to a terminal of the electrical part so as to establish an electrical connection therebetween;
a printed circuit board side contact portion formed to one of the curved portions of the springy portion so as to be contacted to the printed circuit board to establish an electrical connection therebetween; and
an electrical path formed between the electrical part side contact portion and the printed circuit board side contact portion, said electric path having substantially a linear structure.

15. A contact pin for a socket for an electrical part to be mounted to a socket body of the socket, comprising:
a base portion mounted to the socket body; and
a springy portion extending from the base portion, said springy portion including a plurality of curved portions, an electrical part side contact portion at an end portion thereof, and a printed circuit board side contact portion at one of the curved portions on the side of the electrical part side contact portion,
wherein another one of the curved portions projecting upward is positioned between the base portion and the printed circuit board side contact portion.

* * * * *